(12) United States Patent
Takahashi et al.

(10) Patent No.: US 6,426,017 B2
(45) Date of Patent: Jul. 30, 2002

(54) PIEZOELECTRIC CERAMIC COMPOSITION AND PIEZOELECTRIC ELEMENT USING THE SAME

(75) Inventors: Keiichi Takahashi; Masamitsu Nishida, both of Osaka; Hiroshi Sogou, Hyogo, all of (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 09/792,951

(22) Filed: Feb. 26, 2001

(30) Foreign Application Priority Data

Feb. 29, 2000 (JP) ........................... 2000-053661

(51) Int. Cl.[7] ............... C04B 35/495; C04B 35/00; H01L 41/187
(52) U.S. Cl. ............... 252/62.9 R; 501/136; 501/137; 501/138; 310/365
(58) Field of Search ............... 310/365; 501/136, 501/137, 138; 252/62.9 R

(56) References Cited

FOREIGN PATENT DOCUMENTS

| EP | 982 782 | 3/2000 |
|---|---|---|
| JP | 2000-313662 | 11/2000 |

OTHER PUBLICATIONS

"Energy Trapping Characteristics of Bismuth Layer Structured Compound Ca $Bi_4Ti_4O_{15}$"; Kimura, M.; Sawada, T.; Ando, A.; Sakabe, Y.; Japanese Journal Of Applied Physics; vol. 38; 1999; pp. 5557–5560.

Primary Examiner—C. Melissa Koslow
(74) Attorney, Agent, or Firm—Merchant & Gould PC

(57) ABSTRACT

The piezoelectric ceramic composition of the present invention contains, as a main component, a material having a composition represented by Formula: $CaM_xBi_{4-x}Ti_{4-x}(Nb_{1-A}Ta_A)_xO_{15}$, where M is at least one element selected from the group consisting of Ca, Sr, and Ba; $0.0 \leq A \leq 1.0$; and $0.0 \leq X \leq 0.6$.

16 Claims, 3 Drawing Sheets

PIEZOELECTRIC CERAMIC COMPOSITION AND PIEZOELECTRIC ELEMENT USING THE SAME

BACKGROUND OF THE INVENTION

1. Field of the Invention

The present invention relates to a piezoelectric ceramic composition and a piezoelectric element using the same.

2. Description of the Related Art

As a piezoelectric ceramic composition used for a piezoelectric ceramic element such as a piezoelectric ceramic resonator, in general, a ceramic composition containing lead zirconate titanate (PZT) or lead titanate (PT) as a main component has been used.

In recent years, as alternatives to the above-mentioned ceramic composition, those containing no lead have been developed. More specifically, as ceramics for a sensor actuator usable at high temperatures, a piezoelectric ceramic composition containing a layered bismuth compound as a main component has been considered.

However, the conventionally reported piezoelectric ceramic composition containing a layered bismuth compound as a main component has a problem in that an electromechanical coupling factor is not large enough. Thus, such a composition has not been put into practical use.

SUMMARY OF THE INVENTION

Therefore, with the foregoing in mind, it is an object of the present invention to provide a piezoelectric ceramic composition having an electromechanical coupling factor larger than that of the conventional composition containing a layered bismuth compound by conventional ceramics processing and a piezoelectric element using the same.

In order to achieve the above-mentioned object, a first piezoelectric ceramic composition of the present invention contains, as a main component, a material having a composition represented by Formula: $CaM_XBi_{4-X}Ti_{4-X}(Nb_{1-A}Ta_A)_XO_{15}$, where M is at least one element selected from the group consisting of Ca, Sr, and Ba; $0.0 \leq A \leq 1.0$; and $0.0 \leq X \leq 0.6$. The first piezoelectric ceramic composition is composed of a main component alone, or composed of a main component and a subsidiary component. According to the first piezoelectric ceramic composition, a piezoelectric ceramic composition having an electromechanical coupling factor larger than that of a conventional layered bismuth compound and containing no lead is obtained.

The above-mentioned first piezoelectric ceramic composition further may contain $MnO_2$ as a subsidiary component. According to this constitution, a piezoelectric ceramic composition having satisfactory characteristics such as a mechanical quality factor is obtained.

In the above-mentioned first piezoelectric ceramic composition, a content of the $MnO_2$ may be 0.6% by mass or less.

Furthermore, a second piezoelectric ceramic composition of the present invention contains, as a main component, a material having a composition represented by Formula: $CaM_YBi_{4-Y}Ti_{4-Y}(Nb_{1-B}Ta_B)_YO_{15}$, where M is at least one element selected from the group consisting of Ca, Sr, and Ba; $0.0 \leq B \leq 1.0$; and $0.0 \leq Y \leq 0.6$, and contains $WO_3$ as a subsidiary component. According to the second piezoelectric ceramic composition, a piezoelectric ceramic composition having an electromechanical coupling factor larger than that of a conventional layered bismuth compound and containing no lead is obtained.

In the above-mentioned second piezoelectric ceramic composition, a content of the $WO_3$ may be 0.5% by mass or less. According to this constitution, polarization will not be difficult.

The above-mentioned second piezoelectric ceramic composition further may contain $MnO_2$ as a subsidiary component. According to this constitution, a piezoelectric ceramic composition having satisfactory characteristics such as a mechanical quality factor is obtained.

Furthermore, a first piezoelectric element of the present invention includes a piezoelectric substance made of a piezoelectric ceramic composition, wherein the piezoelectric ceramic composition contains, as a main component, a material having a composition represented by Formula: $CaM_XBi_{4-X}Ti_{4-X}(Nb_{1-A}Ta_A)_XO_{15}$, where M is at least one element selected from the group consisting of Ca, Sr, and Ba; $0.0 \leq A \leq 1.0$; and $0.0 \leq X \leq 0.6$. According to the first piezoelectric element, a piezoelectric element having satisfactory electrical characteristics and containing no lead is obtained.

In the above-mentioned first piezoelectric element, the piezoelectric ceramic composition further may contain $MnO_2$ as a subsidiary component.

In the above-mentioned first piezoelectric element, a content of the $MnO_2$ in the piezoelectric ceramic composition may be 0.6% by mass or less.

The above-mentioned first piezoelectric element further may include two vibrating electrodes formed on the piezoelectric substance so as to be opposed to each other with the piezoelectric substance interposed therebetween, wherein a thickness t of the piezoelectric substance and an area S of the vibrating electrode satisfy a relationship: $22 \leq S/t^2$. According to this constitution, a piezoelectric resonator that is designed and produced easily is obtained.

In the above-mentioned first piezoelectric element, the vibrating electrodes may have a circular shape.

Furthermore, a second piezoelectric element of the present invention includes a piezoelectric substance made of a piezoelectric ceramic composition, wherein the piezoelectric ceramic composition contains, as a main component, a material having a composition represented by Formula: $CaM_YBi_{4-Y}Ti_{4-Y}(Nb_{1-B}Ta_B)_YO_{15}$, where M is at least one element selected from the group consisting of Ca, Sr, and Ba; $0.0 \leq B \leq 1.0$; and $0.0 \leq Y \leq 0.6$, and contains $WO_3$ as a subsidiary component. According to the second piezoelectric element, a piezoelectric element having satisfactory electrical characteristics and containing no lead is obtained.

In the above-mentioned second piezoelectric element, a content of the $WO_3$ in the piezoelectric ceramic composition may be 0.5% by mass or less.

In the above-mentioned second piezoelectric element, the piezoelectric ceramic composition further may contain $MnO_2$ as a subsidiary component.

The above-mentioned second piezoelectric element further may include two vibrating electrodes formed on the piezoelectric substance so as to be opposed to each other with the piezoelectric substance interposed therebetween, wherein a thickness t of the piezoelectric substance and an area S of the vibrating electrode satisfy a relationship: $22 \leq S/t^2$.

In the above-mentioned second piezoelectric element, the vibrating electrodes may have a circular shape.

These and other advantages of the present invention will become apparent to those skilled in the art upon reading and understanding the following detailed description with reference to the accompanying figures.

DESCRIPTION OF THE PREFERRED EMBODIMENTS

Figure 1:
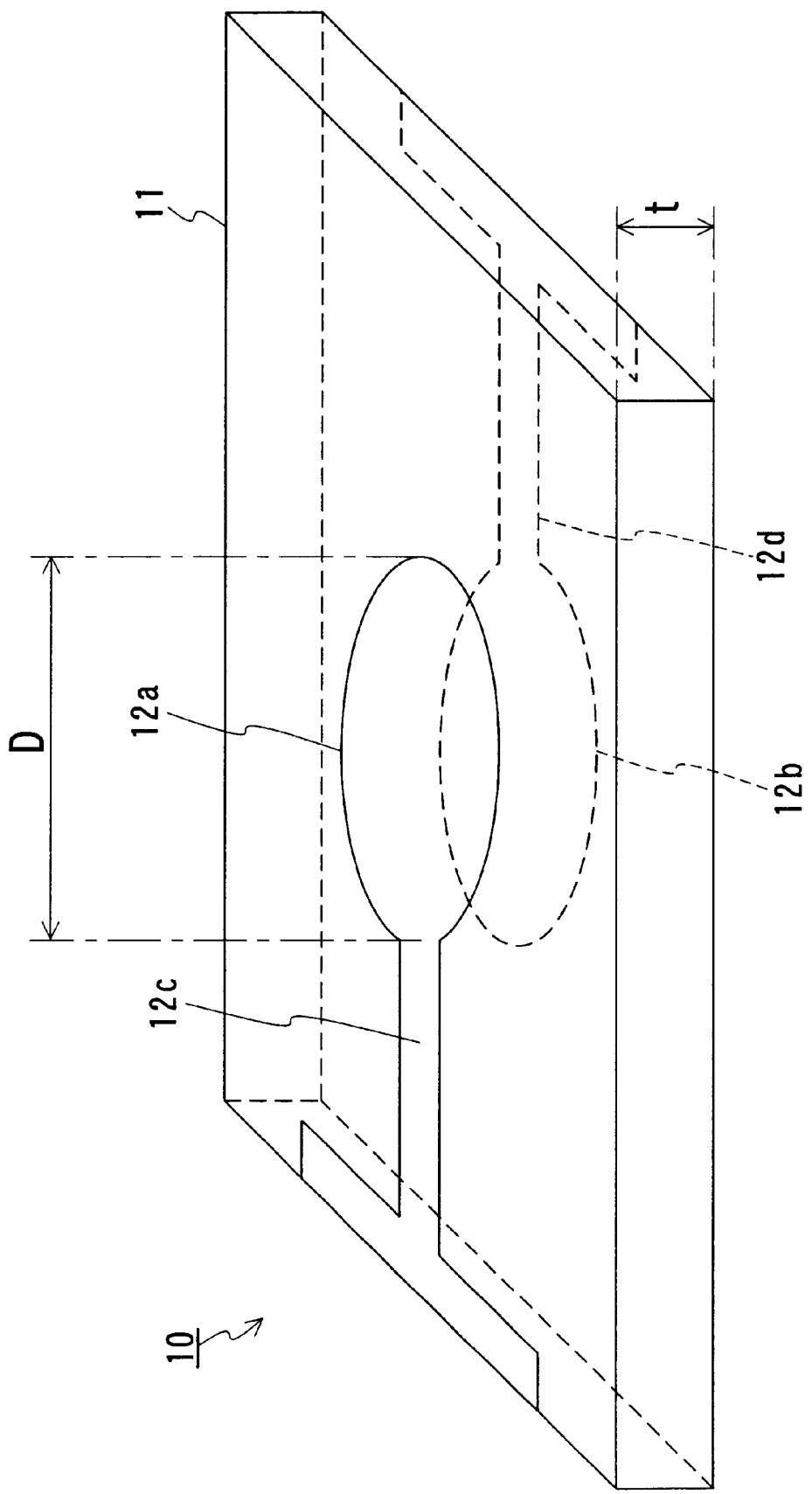
FIG. 1 is a perspective view showing an exemplary piezoelectric resonator according to the present invention.

Hereinafter, the present invention will be described by way of illustrative embodiments with reference to the drawings.

Embodiment 1

In Embodiment 1, a first piezoelectric ceramic composition of the present invention will be described.

The piezoelectric ceramic composition of Embodiment 1 (which hereinafter may be referred to as a "piezoelectric ceramic composition 1") contains, as a main component, a material having a composition represented by Formula: $CaM_XBi_{4-X}Ti_{4-X}(Nb_{1-A}Ta_A)_XO_{15}$, where M is at least one element selected from the group consisting of Ca, Sr, and Ba; $0.0 \leq A \leq 1.0$; and $0.0 \leq X \leq 0.6$. Herein, it is more preferable that A satisfies $0 \leq A \leq 0.4$ Furthermore, it is more preferable that X satisfies $0.1 \leq X \leq 0.4$.

The material to be a main component can be formed by mixing compounds such as $CaCO_3$, $SrCO_3$, $BaCO_3$, $Bi_2O_3$, $TiO_2$, $Nb_2O_5$, and $Ta_2O_5$ in a predetermined ratio.

The piezoelectric ceramic composition 1 further may contain $MnO_2$ or the like as a subsidiary component. The content of $MnO_2$ is preferably 0.6% by mass or less, more preferably in a range of 0.01 to 0.6% by mass, and in particular, preferably in a range of 0.2 to 0.5% by mass.

The piezoelectric ceramic composition 1 may be composed of a main component alone. In the case where the piezoelectric ceramic composition 1 is composed of a main component alone, the composition of the piezoelectric ceramic composition 1 can be represented by Formula: $CaM_XBi_{4-X}Ti_{4-X}(Nb_{1-A}Ta_A)_XO_{15}$.

Furthermore, the piezoelectric ceramic composition 1 may be composed of a main component and a subsidiary component. In this case, the piezoelectric ceramic composition 1 may contain a main component in a content of 96% by mass or more. In the case where the piezoelectric ceramic composition 1 contains a main component and a subsidiary component, starting materials of the main and subsidiary components are mixed and fired, whereby the piezoelectric ceramic composition 1 can be formed. The composition of the piezoelectric ceramic composition 1 containing $MnO_2$ as a subsidiary component can be represented by Formula: $[CaM_XBi_{4-X}Ti_{4-X}Nb_{1-A}Ta_A)_XO_{15}]_{100-L}(MnO_2)_L$. Herein, L represents a content (mol %) of $MnO_2$, which is a value larger than 0.

In the piezoelectric ceramic composition 1, it is preferable that a frequency constant $N_{3t}$ of a third order harmonic vibration in thickness mode is as large as possible. For example, it is preferable that $N_{3t}$ is 7300 Hz.m or larger. In this case, generally, a frequency constant $N_p$ of a radial vibration mode becomes large (i.e., 2500 Hz.m or larger).

According to the piezoelectric ceramic composition 1 of Embodiment 1, a piezoelectric ceramic composition containing no lead and having an electromechanical coupling factor larger than that of a conventional layered bismuth compound is obtained.

Embodiment 2

In Embodiment 2, a second piezoelectric ceramic composition of the present invention will be described.

The piezoelectric ceramic composition of Embodiment 2 (which hereinafter may be referred to as a "piezoelectric ceramic composition 2") contains, as a main component, a material having a composition represented by Formula: $CaM_YBi_{4-Y}Ti_{4-Y}(Nb_{1-B}Ta_B)_YO_{15}$, where M is at least one element selected from the group consisting of Ca, Sr, and Ba; $0.0 \leq B \leq 1.0$; and $0.0 \leq Y \leq 0.6$, and contains $WO_3$ as a subsidiary component. Herein, it is more preferable that B satisfies $0 \leq B \leq 0.4$. Furthermore, it is more preferable that Y satisfies $0.1 \leq Y \leq 0.4$.

The piezoelectric ceramic composition 2 may contain a main component in a content of 96% by mass or more. The material to be a main component can be formed by mixing compounds such as $CaCO_3$, $SrCO_3$, $BaCO_3$, $Bi_2O_3$, $TiO_2$, $Nb_2O_5$, and $Ta_2O_5$ in a predetermined ratio.

The content of $WO_3$ that is a subsidiary component is preferably 0.5% by mass or less, more preferably in a range of 0.01 to 0.5% by mass, and in particular, preferably in a range of 0.1 to 0.4% by mass.

The piezoelectric ceramic composition 2 may contain $MnO_2$ as well as $WO_3$ as a subsidiary component. The content of $MnO_2$ is preferably 0.6% by mass or less, preferably in a range of 0.01 to 0.6% by mass, and in particular, preferably in a range of 0.2 to 0.5% by mass.

The piezoelectric composition 2 can be formed by mixing starting materials of the main and subsidiary components, followed by firing. The composition of the piezoelectric ceramic composition 2 containing $WO_3$ and $MnO_2$ as subsidiary components can be represented by Formula: $[CaM_YBi_{4-Y}Ti_{4-Y}(Nb_{1-B}Ta_B)_YO_{15}]_{100-L-N}(MnO_2)_L(WO_3)_N$.

Herein, L and N represent the contents (mol %) of $MnO_2$ and $WO_3$, and $0 \leq L$, $0 < N$.

In the piezoelectric ceramic composition 2, it is preferable that a frequency constant $N_{3t}$ of a third order harmonic vibration in thickness mode is as large as possible. For example, it is preferable that $N_{3t}$ is 7300 Hz.m or larger. In this case, generally, a frequency constant $N_p$ of a radial vibration mode becomes large (i.e., 2500 Hz.m or larger).

According to the piezoelectric ceramic composition 2 of Embodiment 2, a piezoelectric ceramic composition containing no lead and having an electromechanical coupling factor larger than that of a conventional layered bismuth compound is obtained.

Embodiment 3

In Embodiment 3, a first piezoelectric element of the present invention will be described.

The piezoelectric element of Embodiment 3 (which hereinafter may be referred to as a "piezoelectric element 1") includes a piezoelectric substance made of the piezoelectric ceramic composition 1 described in Embodiment 1.

Specifically, the piezoelectric element 1 is a displacement element such as a piezoelectric resonator (e.g., a ceramic oscillator or a filter), a piezoelectric vibrator (e.g., a buzzer or a speaker), or an actuator FIG. 1 shows a perspective view of a piezoelectric resonator 10 as an example of the piezoelectric element 1. Referring to FIG. 1, the piezoelectric resonator 10 includes a piezoelectric substance 11, and electrodes 12a and 12b formed on two principal planes of the piezoelectric substance 11. Leads 12c and 12d are connected to the electrodes 12a and 12b, respectively.

The electrodes 12a and 12b have a circular shape. The shape of the electrodes 12a and 12b is not limited to a circle, and may be another shape such as a square and a rectangle.

The electrodes 12a and 12b are formed in the same shape so as to be opposed to each other with the piezoelectric substance 11 interposed therebetween.

It is preferable that an area S of the electrode 12a (electrode 12b) and a thickness t of the piezoelectric substance 11 satisfy the relationship: $22 \leq S/t^2$. In other words, it is preferable that a diameter D of the electrode 12a (electrode 12b) and the thickness t of the piezoelectric substance 11 satisfy the relationship: $5.3 \leq D/t$.

Due to the use of the piezoelectric ceramic composition 1 of Embodiment 1, the piezoelectric element 1 of Embodiment 3 does not contain lead and has satisfactory electrical characteristics.

Embodiment 4

In Embodiment 4, a second piezoelectric element of the present invention will be described.

The piezoelectric element of Embodiment 4 (which hereinafter may be referred to as a "piezoelectric element 2") is different from the piezoelectric element 1 of Embodiment 3 only in a material for a piezoelectric substance. Therefore, a common description thereof will be omitted here. A piezoelectric substance of the piezoelectric element 2 is made of the piezoelectric ceramic composition 2 of Embodiment 2.

Due to the use of the piezoelectric ceramic composition 2 of Embodiment 2, the piezoelectric element 2 of Embodiment 4 does not contain lead and has satisfactory electrical characteristics.

EXAMPLES

Hereinafter, the present invention will be described by way of illustrative examples in more detail.

Example 1

In Example 1, an exemplary case will be described in which the piezoelectric ceramic compositions 1 and 2 of Embodiments 1 and 2 were produced.

In Example 1, a plurality of piezoelectric ceramic compositions were formed by using $CaCO_3$, $SrCO_3$, $BaCO_3$, $WO_3$, $Mn_3O_4$, $Bi_2O_3$, $TiO_2$, $Nb_2O_5$, and $Ta_2O_5$ as starting materials. It should be noted that $Mn_3O_4$ becomes $MnO_2$ at a temperature equal to or higher than a firing temperature.

More specifically, the starting materials were weighed so that the composition of each piezoelectric ceramic composition was set to be in a predetermined ratio as shown in Tables 1 to 3, and the starting materials were mixed sufficiently by a ball mill so as to be uniform. Then, the mixture of the starting materials was fired at 600° C. to 800° C. for 2 hours to form a compound. The compound was ground by a ball mill. Polyvinyl alcohol was added to the resultant compound to granulate it, thereby obtaining piezoelectric ceramic composition powder.

The powder was subjected to uniaxial press-molding under a pressure of 70 MPa to form a disk with a diameter of 13 mm. The disk thus obtained was fired at 1100° C. to 1200° C. for 2 hours to form a disk-shaped sample. This sample was polished to a thickness of 0.3 mm, and then, electrodes made of Ag were formed on upper and lower surfaces of the sample. Thereafter, the sample was supplied with an electrical field of 5 kV/mm to 10 kV/mm in silicon oil at 150° C. for 30 minutes, whereby a disk made of piezoelectric ceramics (piezoelectric substance) was obtained.

The obtained disk made of piezoelectric ceramics was measured for a capacitance C at 1 kHz, a thickness t, a diameter D, a resonant frequency Fr of vibration in a thickness direction of the disk, an antiresonant frequency Fa of vibration in a thickness direction of the disk, a resonant frequency fr of vibration in a diameter direction of the disk, an antiresonant frequency fa of vibration in a diameter direction of the disk, a Poisson's ratio $\sigma^E$, and a resonant resistance R. From these values, a relative dielectric constant $\epsilon_r$, an electromechanical coupling factor $k_p$ of a radial vibration mode of the disk, an electromechanical coupling factor $k_t$ of a vibration in thickness mode, a mechanical quality factor $Q_M$, and a frequency constant $N_p$ of a radial vibration mode were calculated.

The calculation results are shown in Tables 1 to 3. The composition of the main component in Table 1 is represented by Formula: $Ca_{1+T}Bi_{4-T}Ti_{4-T}(Nb_{1-C}Ta_C)_TO_{15}$. The composition of the main component in Table 2 is represented by Formula: $CaSr_TBi_{4-T}Ti_{4-T}(Nb_{1-C}Ta_C)_TO_{15}$. The composition of the main component in Table 3 is represented by Formula: $CaBa_TBi_{4-T}Ti_{4-T}(Nb_{1-C}Ta_C)_TO_{15}$. C and T in the column of the main component in Tables 1 to 3 represent values of C and T in the above-mentioned formulas. Furthermore, in the Tables, a symbol "*" before a Sample No. represents a comparative example.

TABLE 1

| | Composition | | | | Piezoelectric characteristics | | | | |
|---|---|---|---|---|---|---|---|---|---|
| | Main component | | Subsidiary component | | $k_t$ | $k_p$ | | $N_p$ | |
| Sample No. | C | T | $WO_3$ [wt %] | $MnO_2$ [wt %] | [%] | [%] | $Q_M$ | [Hz.m] | $\epsilon_r$ |
| *Sample 1 | 0.00 | 0.00 | 0.0 | 0.0 | 10.8 | 3.7 | 2510 | 2940 | 147 |
| Sample 2 | 0.00 | 0.01 | 0.0 | 0.0 | 12.4 | 5.8 | 2140 | 2920 | 148 |
| Sample 3 | 0.00 | 0.10 | 0.0 | 0.0 | 18.6 | 6.2 | 1760 | 2900 | 148 |
| Sample 4 | 0.00 | 0.60 | 0.0 | 0.0 | 11.1 | 4.1 | 1950 | 2900 | 144 |
| *Sample 5 | 0.00 | 0.80 | 0.0 | 0.0 | — | — | — | — | 142 |
| Sample 6 | 0.00 | 0.00 | 0.4 | 0.0 | 14.0 | 3.8 | 2570 | 2940 | 145 |
| Sample 7 | 0.00 | 0.20 | 0.4 | 0.0 | 14.3 | 3.3 | 1930 | 2820 | 135 |
| Sample 8 | 0.00 | 0.40 | 0.4 | 0.0 | 14.0 | 2.6 | 1890 | 2830 | 134 |
| Sample 9 | 0.00 | 0.60 | 0.4 | 0.0 | 13.5 | 0.75 | 1790 | 2880 | 132 |
| *Sample 10 | 0.00 | 0.80 | 0.4 | 0.0 | — | — | — | — | 132 |
| Sample 11 | 0.00 | 0.00 | 0.1 | 0.0 | 13.5 | 5.3 | 2450 | 2950 | 145 |
| Sample 12 | 0.00 | 0.00 | 0.3 | 0.0 | 13.8 | 4.2 | 2870 | 2930 | 144 |
| Sample 13 | 0.00 | 0.00 | 0.5 | 0.0 | 12.8 | 3.8 | 2240 | 2920 | 141 |

TABLE 1-continued

| | Composition | | | | Piezoelectric characteristics | | | | |
|---|---|---|---|---|---|---|---|---|---|
| | Main component | | Subsidiary component | | $k_t$ | $k_p$ | | $N_p$ | |
| Sample No. | C | T | WO$_3$ [wt %] | MnO$_2$ [wt %] | [%] | [%] | $Q_M$ | [Hz.m] | $\epsilon_r$ |
| Sample 14 | 0.00 | 0.00 | 0.7 | 0.0 | 9.0 | 3.5 | 1430 | 2920 | 139 |
| Sample 15 | 0.00 | 0.10 | 0.0 | 0.1 | 19.4 | 5.9 | 3810 | 2980 | 143 |
| Sample 16 | 0.00 | 0.10 | 0.0 | 0.3 | 22.1 | 6.3 | 4710 | 2990 | 144 |
| Sample 17 | 0.00 | 0.10 | 0.0 | 0.6 | 22.3 | 6.1 | 3630 | 2980 | 145 |
| Sample 18 | 0.00 | 0.10 | 0.0 | 1.2 | 7.4 | 2.2 | 1820 | 2960 | 146 |
| Sample 19 | 0.00 | 0.00 | 0.2 | 0.2 | 27.3 | 7.9 | 5890 | 2970 | 140 |
| Sample 20 | 0.00 | 0.20 | 0.2 | 0.2 | 24.2 | 7.5 | 4720 | 2960 | 136 |
| Sample 21 | 0.00 | 0.40 | 0.2 | 0.2 | 19.1 | 6.2 | 3830 | 2950 | 135 |
| Sample 22 | 0.00 | 0.60 | 0.2 | 0.2 | 12.5 | 0.85 | 3430 | 2970 | 132 |
| *Sample 23 | 0.00 | 0.80 | 0.2 | 0.2 | — | — | — | — | 130 |
| Sample 24 | 0.25 | 0.20 | 0.0 | 0.5 | 16.6 | 5.6 | 3880 | 2930 | 142 |
| Sample 25 | 0.50 | 0.20 | 0.0 | 0.5 | 21.1 | 7.0 | 4460 | 2970 | 145 |
| Sample 26 | 0.50 | 0.20 | 0.2 | 0.2 | 23.3 | 5.5 | 4410 | 2970 | 142 |
| Sample 27 | 0.50 | 0.40 | 0.2 | 0.2 | 21.5 | 4.2 | 4330 | 2920 | 133 |
| Sample 28 | 0.50 | 0.60 | 0.2 | 0.2 | 12.0 | 1.4 | 2100 | 2890 | 132 |
| Sample 29 | 0.75 | 0.20 | 0.0 | 0.5 | 16.4 | 4.9 | 4340 | 2920 | 153 |
| Sample 30 | 1.00 | 0.20 | 0.0 | 0.5 | 18.8 | 5.1 | 3160 | 2970 | 156 |
| Sample 31 | 1.00 | 0.20 | 0.2 | 0.2 | 19.4 | 7.8 | 3390 | 2900 | 131 |
| Sample 32 | 1.00 | 0.40 | 0.2 | 0.2 | 16.9 | 4.2 | 3270 | 2900 | 132 |
| Sample 33 | 1.00 | 0.60 | 0.2 | 0.2 | 11.7 | 0.8 | 2480 | 2990 | 132 |

TABLE 2

| | Composition | | | | Piezoelectric characteristics | | | | |
|---|---|---|---|---|---|---|---|---|---|
| | Main component | | Subsidiary component | | $k_t$ | $k_p$ | | $N_p$ | |
| Sample No. | C | T | WO$_3$ [wt %] | MnO$_2$ [wt %] | [%] | [%] | $Q_M$ | [Hz.m] | $\epsilon_r$ |
| Sample 34 | 0.00 | 0.00 | 0.1 | 0.4 | 24.8 | 6.7 | 4700 | 2940 | 138 |
| Sample 35 | 0.00 | 0.20 | 0.1 | 0.4 | 29.5 | 6.8 | 4380 | 2970 | 143 |
| Sample 36 | 0.00 | 0.40 | 0.1 | 0.4 | 28.0 | 6.5 | 4110 | 2970 | 146 |
| Sample 37 | 0.00 | 0.60 | 0.1 | 0.4 | 17.6 | 5.5 | 3110 | 2950 | 137 |
| *Sample 38 | 0.00 | 0.80 | 0.1 | 0.4 | 10.4 | 5.1 | 3260 | 2950 | 136 |
| Sample 39 | 1.00 | 0.20 | 0.1 | 0.4 | 20.1 | 5.8 | 3370 | 2920 | 144 |
| Sample 40 | 1.00 | 0.40 | 0.1 | 0.4 | 19.4 | 4.7 | 2940 | 2850 | 149 |
| Sample 41 | 1.00 | 0.60 | 0.1 | 0.4 | 14.7 | 4.7 | 2340 | 2800 | 143 |
| *Sample 42 | 1.00 | 0.80 | 0.1 | 0.4 | 8.9 | 3.6 | 2280 | 2780 | 142 |

TABLE 3

| | Composition | | | | Piezoelectric characteristics | | | | |
|---|---|---|---|---|---|---|---|---|---|
| | Main component | | Subsidiary component | | $k_t$ | $k_p$ | | $N_p$ | |
| Sample No. | C | T | WO$_3$ [wt %] | MnO$_2$ [wt %] | [%] | [%] | $Q_M$ | [Hz.m] | $\epsilon_r$ |
| *Sample 43 | 0.00 | 0.00 | 0.0 | 0.5 | 24.6 | 6.9 | 2930 | 2720 | 157 |
| Sample 44 | 0.00 | 0.20 | 0.0 | 0.5 | 24.0 | 6.8 | 3150 | 2720 | 154 |
| Sample 45 | 0.00 | 0.40 | 0.0 | 0.5 | 23.1 | 6.6 | 3020 | 2710 | 152 |
| Sample 46 | 0.00 | 0.60 | 0.0 | 0.5 | 12.6 | 6.6 | 3030 | 2700 | 154 |
| *Sample 47 | 0.00 | 0.80 | 0.0 | 0.5 | 10.1 | 5.2 | 2870 | 2680 | 151 |
| Sample 48 | 1.00 | 0.20 | 0.0 | 0.5 | 22.1 | 6.5 | 2890 | 2705 | 154 |
| Sample 49 | 1.00 | 0.40 | 0.0 | 0.5 | 23.1 | 6.2 | 2730 | 2680 | 157 |
| Sample 50 | 1.00 | 0.60 | 0.0 | 0.5 | 16.2 | 6.0 | 2480 | 2690 | 153 |

In the case of using piezoelectric ceramics for a piezoelectric substance of a piezoelectric element utilizing a vibration in thickness mode including a third order harmonic, an electromechanical coupling factor $k_t$ of a vibration in thickness mode particularly is important. As is apparent from Tables 1 to 3, the piezoelectric ceramics of the present invention had an electromechanical coupling factor $k_t$ larger than that of the piezoelectric ceramics ($CaBi_4Ti_4O_{15}$) of a sample 1. In this manner, by dissolving Nb or Ta and an element M in $CaBi_4Ti_4O_{15}$, an electromechanical coupling factor $k_t$ was increased. Furthermore, by adding $WO_3$ to $CaBi_4Ti_4O_{15}$, an electromechanical coupling factor $k_t$ was increased.

In particular, by using a piezoelectric ceramic composition under the condition of $0.1 \leq T \leq 0.2$ and $C=0.0$, an electromechanical coupling factor $k_t$ and a mechanical quality factor $Q_M$ were increased.

Example 2

In Example 2, an exemplary case will be described in which a piezoelectric resonator 10 was produced using the ceramic composition of the present invention.

In the piezoelectric resonator of Example 2, a piezoelectric ceramic composition of a sample 35 in Example 1 was used as a piezoelectric substance. A piezoelectric substance was formed by dicing and polishing a disk sample after polarization. As electrodes 12a and 12b, circular electrodes made of silver were used. The electrodes 12a and 12b were formed by vapor deposition.

Figure 2:
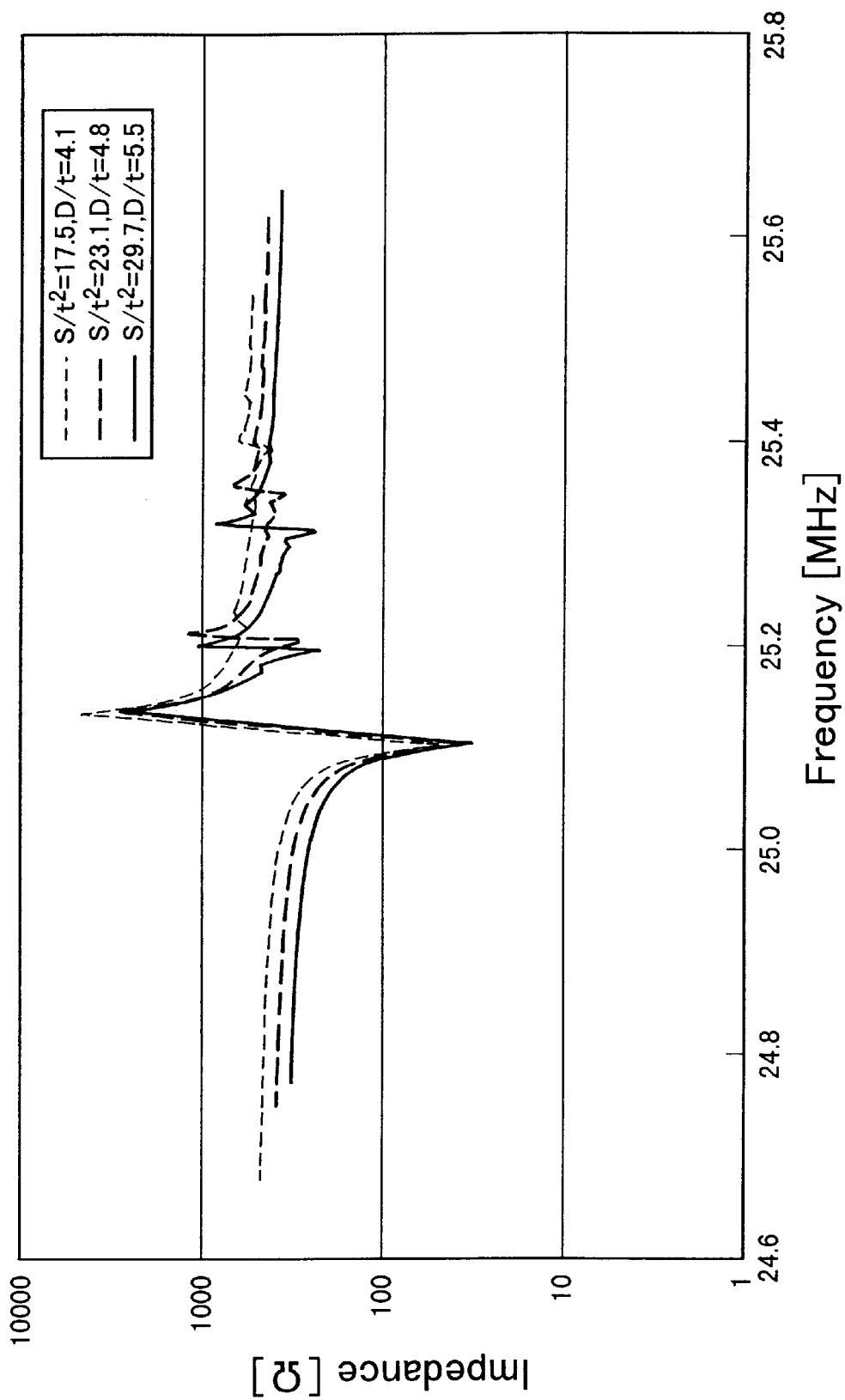
FIG. 2 is a graph showing exemplary impedance characteristics of the piezoelectric resonator according to the present invention.
Figure 3:
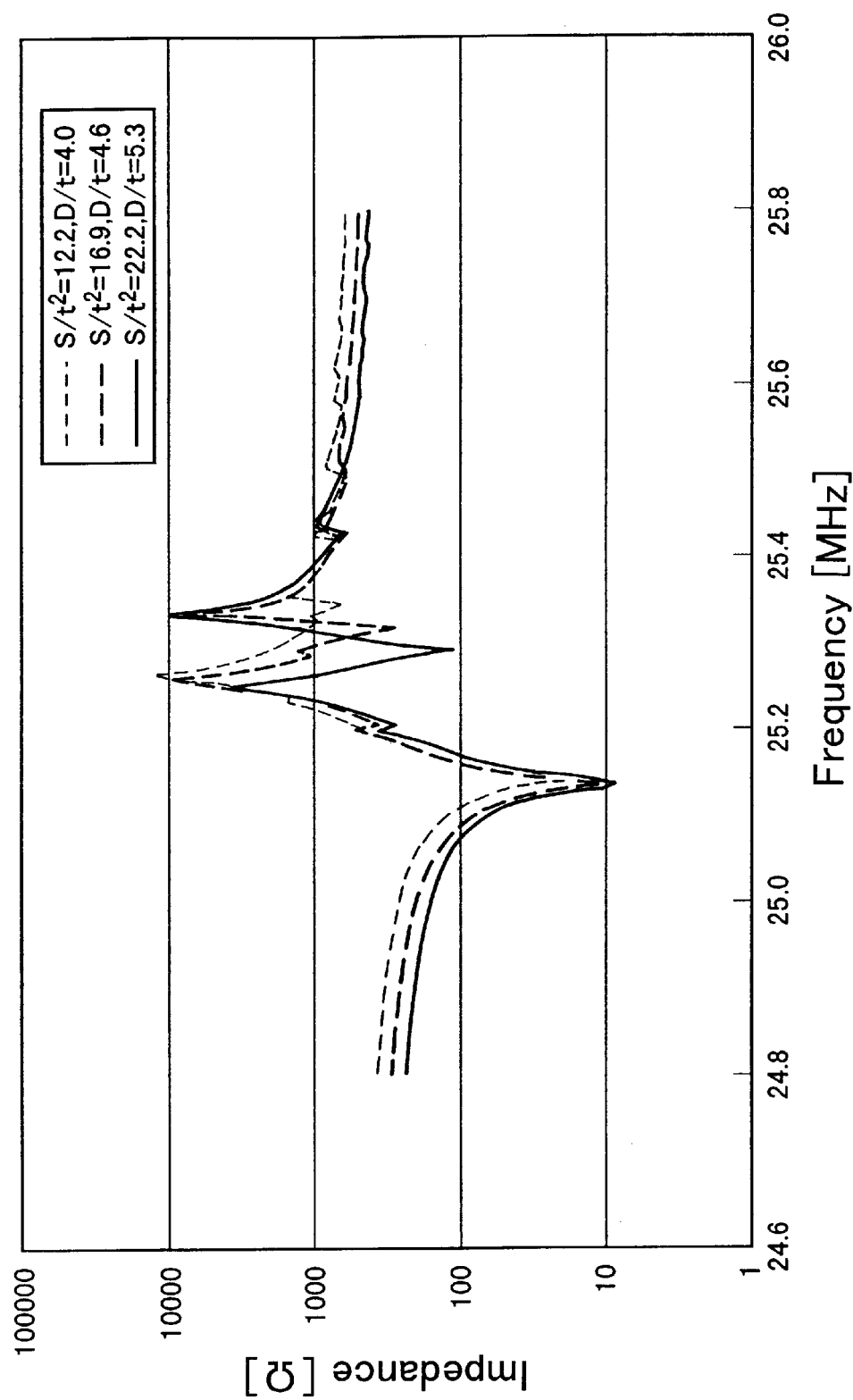
FIG. 3 is a graph showing exemplary impedance characteristics of a conventional piezoelectric resonator.

In Example 2, a piezoelectric substance with a size of 5.1 mm×5.1 mm, and a thickness t of 0.29 mm was used. A diameter D of the Ag electrode was varied from about 1.2 mm to about 1.6 mm, whereby three kinds of piezoelectric resonators were produced. FIG. 2 shows impedance characteristics of these three kinds of piezoelectric resonators. Furthermore, FIG. 3 shows the measurement results of impedance characteristics regarding a piezoelectric resonator using conventional lead-containing piezoelectric ceramics as a piezoelectric substance. FIGS. 2 and 3 also show a relationship between the area S of the electrode and the thickness t of the piezoelectric substance.

As is apparent from FIG. 2, in the piezoelectric resonator of the present invention with a resonant frequency of about 25 MHz, even in the case of $D/t=5.5$ ($S/t^2=29.7$), unnecessary vibration did not occur between the resonant frequency and the antiresonant frequency. Furthermore, in the piezoelectric resonator of the present invention, even in the cases of $D/t=4.1$ ($S/t^2=17.5$), $D/t=4.8$ ($S/t^2=23.1$), and $D/t=5.5$ ($S/t^2=29.7$), subsidiary resonance did not occur between the resonant frequency and the antiresonant frequency.

In contrast, in the piezoelectric resonator using a conventional piezoelectric ceramic composition containing lead, in the case of $5.3 \leq D/t$ ($22 \leq S/t^2$), an amplitude of subsidiary resonance was increased in the vicinity of the antiresonant frequency, and the waveform of an impedance was split largely in the vicinity of the antiresonant frequency. Thus, when a conventional piezoelectric ceramic composition was used, a practical piezoelectric resonator was not produced in the case of $5.3 \leq D/t$.

As described above, in the piezoelectric resonator using the piezoelectric ceramic composition of the present invention, there are fewer constraints in terms of design. Furthermore, the piezoelectric resonator is allowed to use a large electrode, and it can be produced easily.

The invention may be embodied in other forms without departing from the spirit or essential characteristics thereof. The embodiments disclosed in this application are to be considered in all respects as illustrative and not limiting. The scope of the invention is indicated by the appended claims rather than by the foregoing description, and all changes which come within the meaning and range of equivalency of the claims are intended to be embraced therein.

What is claimed is:

1. A piezoelectric ceramic composition comprising, as a main component, a material having a composition represented by Formula: $CaM_XBi_{4-X}Ti_{4-X}(Nb_{1-A}Ta_A)_XO_{15}$, where M is at least one element selected from the group consisting of Ca, Sr, and Ba; $0.0 \leq A \leq 1.0$; and $0.0 \leq X \leq 0.6$.

2. A piezoelectric ceramic composition according to claim 1, further comprising $MnO_2$ as a subsidiary component.

3. A piezoelectric ceramic composition according to claim 2, wherein a content of the $MnO_2$ is 0.6% by mass or less.

4. A piezoelectric ceramic composition comprising, as a main component, a material having a composition represented by Formula: $CaM_YBi_{4-Y}Ti_{4-Y}(Nb_{1-B}Ta_B)_YO_{15}$, where M is at least one element selected from the group consisting of Ca, Sr, and Ba; $0.0 \leq B \leq 1.0$; and $0.0 \leq Y \leq 0.6$, and comprising $WO_3$ as a subsidiary component.

5. A piezoelectric ceramic composition according to claim 4, wherein a content of the $WO_3$ is 0.5% by mass or less.

6. A piezoelectric ceramic composition according to claim 4, further comprising $MnO_2$ as a subsidiary component.

7. A piezoelectric element comprising a piezoelectric substance made of a piezoelectric ceramic composition, wherein the piezoelectric ceramic composition contains, as a main component, a material having a composition represented by Formula: $CaM_XBi_{4-X}Ti_{4-X}(Nb_{1-A}Ta_A)_XO_{15}$, where M is at least one element selected from the group consisting of Ca, Sr, and Ba; $0.0 \leq A \leq 1.0$; and $0.0 \leq X \leq 0.6$.

8. A piezoelectric element according to claim 7, wherein the piezoelectric ceramic composition further comprises $MnO_2$ as a subsidiary component.

9. A piezoelectric element according to claim 8, wherein a content of the $MnO_2$ in the piezoelectric ceramic composition is 0.6% by mass or less.

10. A piezoelectric element according to claim 7, further comprising two vibrating electrodes formed on the piezoelectric substance so as to be opposed to each other with the piezoelectric substance interposed therebetween, wherein a thickness t of the piezoelectric substance and an area S of the vibrating electrode satisfy a relationship: $22 \leq S/t^2$.

11. A piezoelectric element according to claim 10, wherein the vibrating electrodes have a circular shape.

12. A piezoelectric element comprising a piezoelectric substance made of a piezoelectric ceramic composition, wherein the piezoelectric ceramic composition contains, as a main component, a material having a composition represented by Formula: $CaM_YBi_{4-Y}Ti_{4-Y}(Nb_{1-B}Ta_B)_YO_{15}$, where M is at least one element selected from the group consisting of Ca, Sr, and Ba; $0.0 \leq B \leq 1.0$; and $0.0 \leq Y \leq 0.6$, and contains $WO_3$ as a subsidiary component.

13. A piezoelectric element according to claim 12, wherein a content of the $WO_3$ in the piezoelectric ceramic composition is 0.5% by mass or less.

14. A piezoelectric element according to claim 12, wherein the piezoelectric ceramic composition further contains $MnO_2$ as a subsidiary component.

15. A piezoelectric element according to claim 12, further comprising two vibrating electrodes formed on the piezoelectric substance so as to be opposed to each other with the piezoelectric substance interposed therebetween, wherein a thickness t of the piezoelectric substance and an area S of the vibrating electrode satisfy a relationship: $22 \leq S/t^2$.

16. A piezoelectric element according to claim 15, wherein the vibrating electrodes have a circular shape.

* * * * *